United States Patent [19]

Rozylowicz et al.

[11] 4,034,289
[45] July 5, 1977

[54] RF POWER MONITOR UTILIZING BI-DIRECTIONAL COUPLER

[75] Inventors: Edward Francis Rozylowicz, Villa Park; Steven Glen Twiselton, Lake Zurich, both of Ill.

[73] Assignee: Motorola, Inc., Schaumburg, Ill.

[22] Filed: Jan. 5, 1976

[21] Appl. No.: 646,456

[52] U.S. Cl. .................................. 324/95; 324/105; 324/126; 333/10
[51] Int. Cl.² ..................... G01R 21/04; H01P 5/14
[58] Field of Search ..................... 324/95, 126, 105; 333/10

[56] References Cited

UNITED STATES PATENTS

| | | | |
|---|---|---|---|
| 2,416,977 | 3/1947 | Brown et al. | 324/95 |
| 3,626,290 | 12/1971 | Aslan | 324/95 |
| 3,760,271 | 9/1973 | Bach, Jr. et al. | 324/95 |
| 3,829,770 | 8/1974 | Stevens | 324/95 |

Primary Examiner—Rudolph V. Rolinec
Assistant Examiner—Ernest F. Karlsen
Attorney, Agent, or Firm—James W. Gillman; Victor Myer; James P. Hamley

[57] ABSTRACT

The coupler inserts in an RF transmission line and produces a pair of DC signals whose level is representative of the magnitude of forward or reverse power flow therethrough.

Power flow is sensed via a pair of non resonant loops, each of which is terminated and oriented such that AC signals, whose amplitudes correspond to the forward or reverse power flow magnitude, are produced. Since the RF signals produced by the loops are dependent on the RF power flow frequency, unique circuitry processes the RF signals and compensates for this frequency dependence whereby the processed AC signals are substantially frequency independent.

Also disclosed are improved rectification circuitry, and a means to compensate the coupler against error due to thermal drift of coupler components.

12 Claims, 4 Drawing Figures

RF POWER MONITOR UTILIZING BI-DIRECTIONAL COUPLER

BACKGROUND OF THE INVENTION

This invention pertains to the electrical power flow monitoring art and, in particular, to a bidirectional, fully compensated, line coupler.

Couplers, used to sense power flow on a line, are well known in the art. Generally, such couplers are employed integral with watt meters, whereby power flow on the line is monitored. In common applications, the coupler is inserted in the line and includes an inductive loop. The loop is oriented with respect to the conductor through the line whereby an electromotive force is generated in the loop proportional to the magnitude of electromagnetic radiation flow through the line. The induced EMF signal is rectified, commonly via a diode, and filtered thus producing a DC signal representative of power flow.

Prior art couplers suffer numerous problems. Firstly, since the power tap-off is realized via inductive coupling, the couplers have been frequency sensitive. Whereas the coupler can be tuned to produce accurate readings at a given frequency, the changing induced EMF at other frequencies produces significant errors in power readings.

A further problem with known couplers is inaccurate RF signal to DC output conversion. A basic source of inaccuracy, which often limits couplers, is the precision with which the rectifiers, e.g. diodes, convert the AC induced EMF to a corresponding DC level. This is a result of the nonlinear rise time of conventional diodes. Further, couplers to date have been temperature sensitive. Therefore, as a coupler is placed in temperatures other than those at which it is calibrated, errors are produced in the power reading.

OBJECTS OF THE INVENTION

It is an object of this invention, therefore, to provide an improved power coupler which maintains its accuracy over a broad frequency range.

It is a further object of the invention to provide the above described improved coupler which employs highly linear rectifier devices.

A further object of the invention is to provide the improved coupler described above which maintains accuracy in power readings over a wide temperature range.

Briefly, according to the invention, a coupler is provided for use in a system which monitors RF power flow on an RF transmission line and produces a DC signal representing power flow thereon. A reactance coupler, such as an inductive loop, electrically couples to the line and, via mutual induction, produces an AC signal whose magnitude depends on the magnitude of power flow on the line. As a necessary consequence of reactance type coupling, the produced AC signal has a magnitude which is also dependent on the frequency of the RF power line flow. A frequency compensating circuit processes the reactance coupling produced signal and, in a predetermined manner, compensates the magnitude thereof in response to the frequency of the RF power flow. In so doing, the magnitude of the frequency compensating circuit processed signal is substantially independent of the RF power line frequency.

The frequency compensated signal is thereafter processed through an improved rectifier which employs highly linear hot carrier diodes. Further circuitry compensates the DC produced rectified signal against thermal drift of coupler components.

DESCRIPTION OF THE PREFERRED EMBODIMENT OF THE INVENTION

Figure 1A:
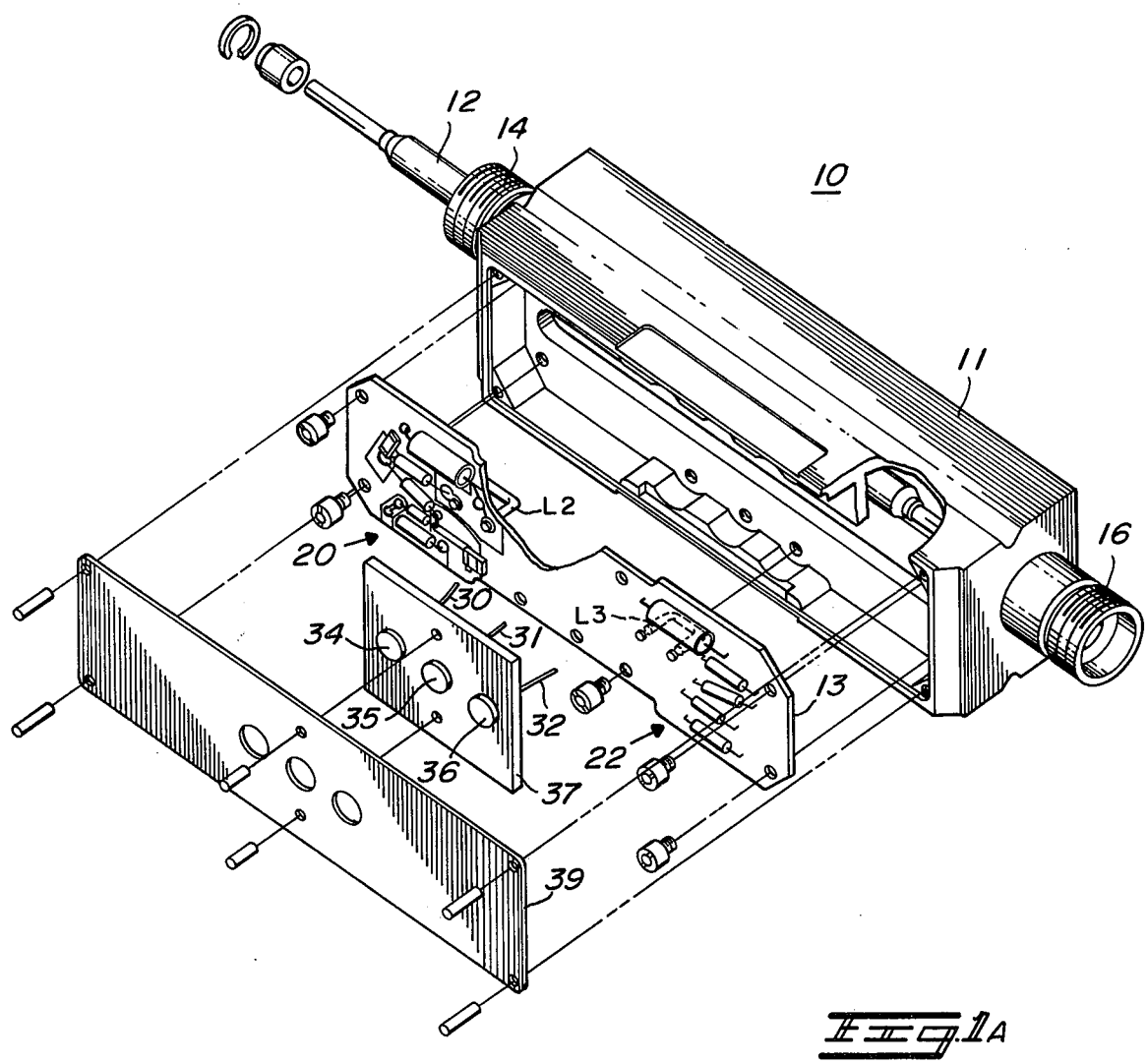
FIGS. 1a and 1b illustrate the preferred construction of the improved coupler.

FIG. 1a is an exploded perspective view of the improved coupler 10 according to the invention. The coupler is comprised of a rectangular metallic body 11, with a rod 12 through the center coupled to N or UHF or similar type connectors 14, 16 at either end.

The rod is secured in the coupler body 11 by insulators and lock washers at either end. A printed circuit board 13 mounts in the body 11 via a plurality of mounting screws. A series of connectors 30, 31, 32 extending from contacts 34, 35, 36 on an insulated board 37 are electrically connected to selected points on the printed circuit board 13. The boards 13, 37 are protected via a bottom plate 39, which is secured to the body 11 via a plurality of mechanical pins.

The $Z_o$ of the coupler is designed to match that of the line to which the coupler is inserted, in this case 50 ohms. The $Z_o$ can be calculated from the formula:

$$Z_o = [138 \log D_1/D_2] \times [1/ \sqrt{K}]$$

where $D_1$ is the inside diameter of the coupler bore, and $D_2$ is the outer diameter of the rod 12, and $K$ is the dielectric of the material between $D_1$ and $D_2$. It is important that the impedance of the line and coupler be approximately equal to maintain a low voltage standing wave radio (VSWR) and consequently minimize the insertion loss of the coupler.

Figure 1B:
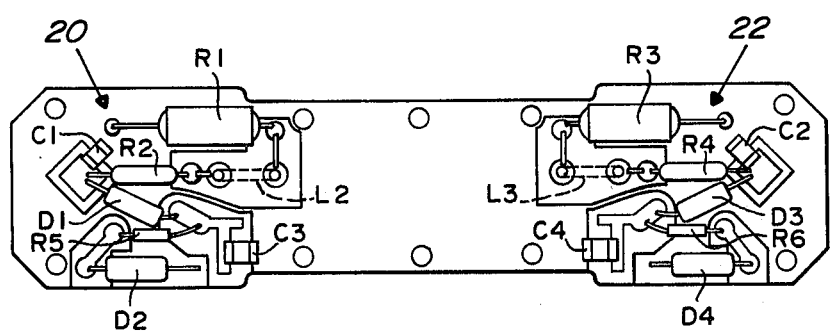

The signal sensing circuitry consists of two identical but oppositely aligned circuits 20, 22 respectively. FIG. 1b illustrates the typical component layout of the circuits 20, 22 on a printed circuit board. Each circuit includes a reactance coupling loop L2, L3 which couples energy capacitively and inductively from the rod 12, which has an inductance L1. The linear distance the loops L2, L3 are spaced from rod 12 determines the amount of energy coupled on the sensing circuits 20, 22 and thereby the power level of the element.

Each loop L2, L3 is terminated by resistors R1, R3, respectively. These resistors are selected to terminate the loops L2, L3 in their characteristic impedance thus eliminating standing waves. This gives the circuits "directivity". Directivity is a measure of the isolation circuit provides from reading signals in the direction opposite to which it is oriented. Thus, for properly oriented loops L2, L3 and properly selected resistors R1, R3, each sensing circuit is made to read power flow in either the forward or reverse direction.

Since the signal appearing across the loops L2, L3 is a result of an inductive coupling, its magnitude is dependent both on the magnitude of power flow on the line and on the frequency of power flow. Thus, sensing circuit 20, 22 calibration would normally be accurate over a very narrow frequency bandwidth. To compensate for the 6db per octave increase of induced EMF signal by the loops L2, L3, with increasing frequency, frequency compensating networks process the loop produced signal. The frequency compensating networks are comprised of a series connection of resistors R2, R4 with capacitors C1, C2 respectively, whose values are selected to provide a precise 6db per octave roll off which compensates for the 6db rise in induced EMF. Thus, the frequency compensated processed output from the compensating networks is of a magnitude substantially independent of the RF power line flow frequency.

Thereafter, the processed signal is rectified via diodes D1, D3. The improved coupler utilizes hot carrier diodes rather than the conventional silicon junction type. Hot carrier diodes have a more linear rise time and, consequently, generate an output rectified signal whose magnitude is linearly related to the input AC signal.

The rectified output of each diode D1, D3 is filtered in capacitors C3, C4, respectively. This filtering produces DC signals which, via interconnecting conductors 30, 32, are passed to output terminals 34, 36 provided within the coupler body. A third output terminal 35 is electrically connected to reference, or ground, potential, by interconnecting conductor 31.

To compensate for thermally induced errors, especially those produced by diodes D1, D3, temperature compensation circuitry is provided. Each compensating circuitry contains a series connected resistor R5, R6 with a second hot carrier diode D2, D4. With increasing temperature, for example, the internal drop across rectifying diodes D1, D3 decreases, whereby the output voltage at terminals 34, 36 tends to increase. To compensate for this, diodes D2, D4 have a correspondingly decreasing internal resistance, thereby exactly compensating for the drift effect. Also, the values of resistors R5, R6 may be selected such that the maximum voltage which can occur at contacts 34, 36 is limited to a value which will not damage an associated DC meter (not shown).

In operation, the coupler is inserted within the line to be monitored. DC signals whose magnitude represent the magnitude of power flow in either the forward or reverse direction on the line are continuously provided at output terminals 34, 36 respectively. These DC signals, along with reference, or ground, potential are coupled to the input terminals of a DC reading meter (not shown), which is preferably calibrated in power units. A switch may be provided within the meter allowing a choice of either the DC signal at terminal 34, or the DC signal at terminal 36, thereby permitting a user to monitor either forward or reverse power flow levels. The accuracy of this system is greatly enhanced over those known in the prior art due to the frequency compensating circuitry, the rectifier linearity of the hot carrier diodes D1, D3, and the temperature compensating circuitry.

Figure 2:
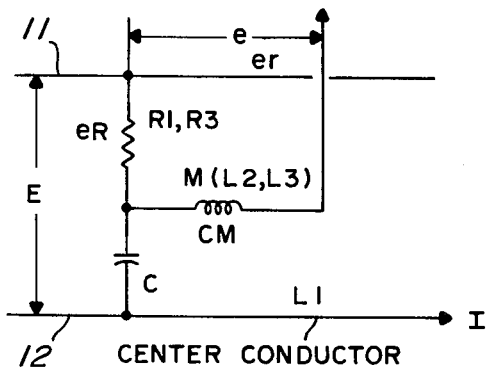
FIG. 2 is a partial schematic of the coupler shown in FIG. 1.

Electrical operation of the coupler shown in FIG. 1 may be better understood with respect to the partial schematic shown in FIG. 2. Shown in current I through rod 12, which is represented as an inductor $L_1$. An electric field E exists between the center conductor 12 and the wall 11 of the coupler. In orientation with center conductor 12 are the pickup loops L2, L3 shown as a single inductor M. Signals passing through rod 12 are picked off and applied across inductance M both via mutual inductance, and inter component capacitance C. The inductance M is terminated on one side by its characteristic resistance R1, R3 whereby the impedance at the opposite end of the inductance M is very high. Thus, a voltage $e$ appears at the output, which voltage is a sum of the voltage drops across the inductance M and the terminating resistance R1, R3. That is:

$$e = eR + eM.$$

Now, $$eR = RE/X_c = REj\,\omega C \ (4R2 < X_c),$$

where $X_c$ is the reactance of capacitor C. Also, $$em = Ij\omega \ (\pm M).$$

Therefore, $$e = j\omega \ (CRE \pm NI) = j\omega M \ (E/Z_o \pm I).$$

Thus, the output voltage $e$ is representative of the power flow on the line in either the forward $(+I)$ or reverse $(-I)$ direction.

Figure 3:
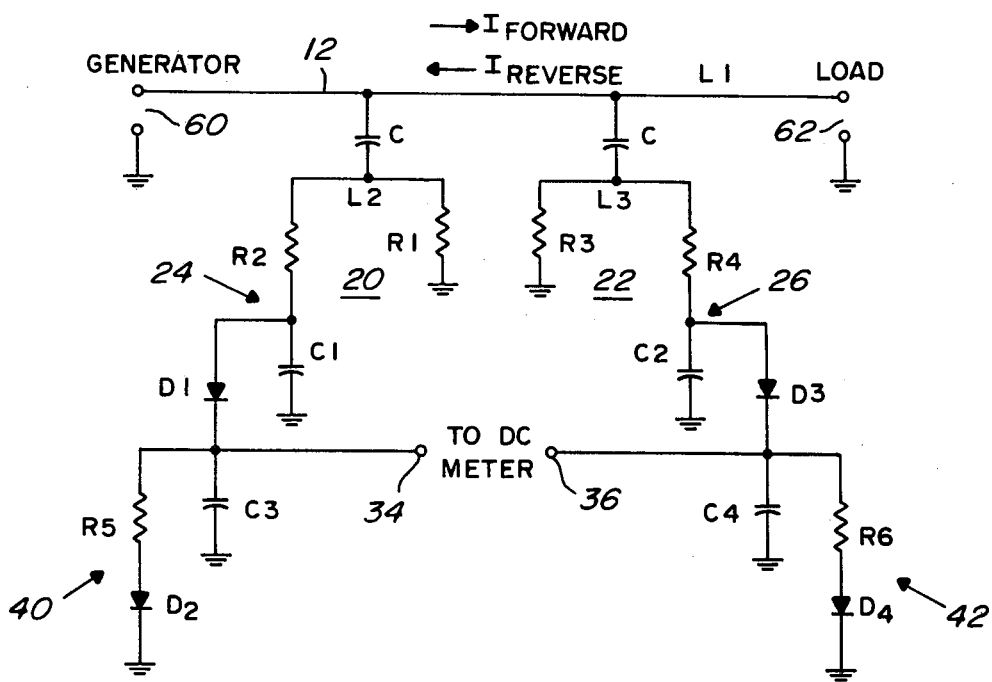
FIG. 3 is a full schematic of the bidirectional coupler illustrated in FIG. 1.

FIG. 3 is a full schematic diagram of the bidirectional coupler illustrated with respect to FIG. 1. In typical operation, for example, power flows from a generator 60 via a transmission line to a load 62, which may be an antenna. The power flow produces a forward current, and reverse current on the center conductor 12 of the line.

As previously mentioned, sensing circuitry 20, 22 is comprised of pickup loops $L_2$, $L_3$ which are terminated in their characteristic impedance by resistors R1, R3. Thus sensing circuitry 20 generates an AC signal whose magnitude is representative of forward current flow, and sensing circuitry 22 generates a signal representative of reverse current flow. The sense signals are frequency compensated via compensating circuitry 24, 26, comprised of R2-C1 and R4-C2, and precisely rectified in linear hot carrier diodes D1, D3. The rectified signal is both filtered in capacitors C3, C4, and temperature compensated via compensating circuitry 40, 42 which is comprised of resistors R5, R6, and second hot carrier diodes D2, D4. Thus the output signals appearing at terminals 34, 36 contain a DC voltage whose magnitude is representative of forward, or reverse power flow. Due to the compensating circuitry employed, each produced DC signal is substantially independent of frequency on the power line and temperature of the coupler components.

In summary, an improved coupler has been described which produces a DC signal whose magnitude is representative of either forward or reverse power flow on a line, which DC signal is substantially independent of the frequency of power on the line, or the temperature of the coupler components. Furthermore, high accuracy is obtained via the incorporation of hot carrier diodes in the rectifying portion of the sensing circuitry.

While a preferred embodiment of the invention has been described, it should be understood that many modifications and variations thereto are possible, all of which fall within the true spirit and scope of the invention.

What is claimed is:

1. In a means for monitoring an RF power line and producing a signal representative of the power flow thereon, apparatus comprising:

reactance coupling means, electrically coupled to the power line in a low power loss configuration, and producing a signal whose magnitude is dependent on the magnitude of power flow on the power line, said reactance coupling means produced signal magnitude also being dependent on the frequency of the RF power line flow;

frequency compensating means for processing the reactance coupling means produced signal and predeterminedly compensating the magnitude thereof in response to the frequency of the RF power flow, such that the magnitude of the frequency compensating means processed signal is substantially independent of the frequency of the RF power line flow over a given frequency range, rectifier means for rectifying and filtering the processed signal to produce a DC signal having a magnitude representative of the magnitude of the RF power flow, said rectifier means including one or more elements which display thermal drift characteristics; and diode means for compensating said DC produced signal against thermal drift.

2. In the monitoring means of claim 1, the means for rectifying the processed signal comprising a hot carrier diode.

3. In the monitoring means of claim 1, the apparatus further comprising
a means for limiting the DC produced voltage to a predetermined maximum.

4. In the monitoring means of claim 1, the reactance coupling means comprising:
a non resonant loop, predeterminedly oriented with respect to the RF power line, and
means for terminating said loop in its characteristic impedance, whereby the loop produces a signal representative of the magnitude of power flow in a single direction on the line.

5. In the monitoring means of claim 4, the frequency compensating means comprising a resistor and a capacitor connected to cause a 6db/octave roll off in the amplitude of the non resonant loop produced signal, the corner frequency of the roll off selected to occur at that power line frequency which causes a corresponding increase in the non resonant loop produced signal.

6. In the monitoring means of claim 4, the apparatus comprising two non resonant loops, and two terminating means, whereby the signal produced by one loop is representative of the magnitude of power flow in one direction on the line, and the signal produced by the other loop is representative of the magnitude of power flow in the opposite direction on the line.

7. A coupler for insertion in an RF power line and producing a pair of DC signals, the first DC signal having an amplitude representative of the magnitude of power flow on the line in the forward direction, the second DC signal having an amplitude representative of the magnitude of power flow in the reverse direction, the coupler comprising:

first reactive coupling means for producing a first AC signal whose amplitude is dependent on the magnitude and frequency of the RF power flow in the forward direction;

second reactive coupling means for producing a second AC signal whose amplitude is dependent on the magnitude and frequency of the RF power flow in the reverse direction;

first frequency compensating means for processing said first AC signal and predeterminedly compensating the amplitude thereof in response to the RF power flow frequency such that the amplitude of the processed first AC signal is substantially independent of the RF power flow frequency;

second frequency compensating means for processing said second AC signal and predeterminedly compensating the amplitude thereof in response to the RF power flow frequency such that the amplitude of the processed second AC signal is substantially independent of the RF power flow frequency first retification means for receiving the compensated first AC signal and producing a first DC signal representative of the amplitude thereof;

second rectification means for receiving the compensated second AC signal and producing a second DC signal representative of the amplitude thereof; and diode means for compensating both the first and second DC voltages against thermal drift.

8. The coupler of claim 6 wherein:
the first and second reactive coupling means each comprise a non resonant loop which is predeterminedly oriented with respect to the power line and each of which is terminated in its characteristic impedance.

9. The coupler of claim 8 wherein the first and second frequency compensating means each comprises a resistor and capacitor connected to cause a 6db/octave roll off in the amplitude of the first and second AC signals, respectively, the corner frequency of the roll off selected to occur at that power line frequency which causes a corresponding increase in the produced signal from each non resonant loop.

10. The coupler of claim 7 wherein each of the first and second rectification means comprises a hot carrier diode.

11. The coupler of claim 7 further comprising a means for limiting both the first and second DC signals to a predetermined maximum.

12. The coupler of claim 7 further comprising:
a coupler having provided with an internal bore;
a rod, secured within the housing, adapted to connect in series in the power line,
the dimensions of the coupler bore and rod being predeterminedly selected such that the impedance of the coupler assembly matches that of the RF power line in both the forward and reverse directions over a selected frequency range.

* * * * *